(12) United States Patent
Toyota

(10) Patent No.: US 9,426,897 B2
(45) Date of Patent: Aug. 23, 2016

(54) ELECTRONIC COMPONENT AND METHOD FOR MANUFACTURING ELECTRONIC COMPONENT

(75) Inventor: Yuji Toyota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/405,380

(22) Filed: Feb. 27, 2012

(65) Prior Publication Data

US 2012/0229991 A1    Sep. 13, 2012

(30) Foreign Application Priority Data

Mar. 8, 2011    (JP) .................. 2011-050176

(51) Int. Cl.
*H05K 3/30*    (2006.01)
*H03H 3/08*    (2006.01)
*H03H 9/10*    (2006.01)

(52) U.S. Cl.
CPC .............. *H05K 3/305* (2013.01); *H03H 3/08* (2013.01); *H03H 9/1071* (2013.01); *H03H 9/1085* (2013.01); *H01L 2224/16225* (2013.01); *Y10T 29/4913* (2015.01)

(58) Field of Classification Search
CPC ........... H05K 3/32; H05K 3/305; H05K 3/30
USPC ............................ 29/832–841; 438/107, 113
See application file for complete search history.

(56) References Cited

U.S. PATENT DOCUMENTS

| | | | | |
|---|---|---|---|---|
| 6,204,564 B1* | 3/2001 | Miyata | .................. | H01L 21/563 257/737 |
| 6,207,473 B1* | 3/2001 | Hirai | ................. | H01L 23/49855 257/620 |
| 6,451,628 B1* | 9/2002 | Tani | ......................... | H01L 21/56 257/E21.502 |
| 6,459,152 B1* | 10/2002 | Tomita | .............. | H01L 23/49822 174/535 |
| 6,870,248 B1* | 3/2005 | Shibata | .................... | H01L 21/56 257/678 |
| 6,881,612 B2* | 4/2005 | Miyasaka | ............. | H01L 21/563 257/E21.503 |
| 7,138,298 B2* | 11/2006 | Shibata | ................... | H01L 21/56 257/666 |
| 7,193,331 B2* | 3/2007 | Ishii | .............................. | 257/790 |
| 7,195,952 B2* | 3/2007 | Vinn et al. | .................... | 438/108 |
| 7,238,548 B2* | 7/2007 | Kurita | .................. | H01L 21/563 257/E21.499 |

(Continued)

FOREIGN PATENT DOCUMENTS

JP    10-163800 A    6/1998
JP    2001-332654 A    11/2001

(Continued)

OTHER PUBLICATIONS

Official Communication issued in corresponding Japanese Patent Application No. 2011-050176, mailed on Jan. 15, 2013.

*Primary Examiner* — Peter DungBa Vo
*Assistant Examiner* — Kaying Kue
(74) *Attorney, Agent, or Firm* — Keating & Bennett, LLP

(57) ABSTRACT

A method for manufacturing an electronic component includes a step of preparing a plurality of electrical elements, a step of preparing a base including a plurality of boards on which the plurality of electrical elements are to be mounted, respectively, a step of forming a resin on the base, a step of pressing the plurality of electrical elements against the resin to join portions of side surfaces of the plurality of electrical elements to the resin, a step of grinding the plurality of electrical elements to thin the plurality of electrical elements, and a step of dividing the base to form the plurality of board into individual pieces.

6 Claims, 4 Drawing Sheets

(56) References Cited

U.S. PATENT DOCUMENTS

| | | | |
|---|---|---|---|
| 7,268,436 B2 * | 9/2007 | Aigner et al. | 257/777 |
| 7,452,752 B2 * | 11/2008 | Noda | H01L 21/67092 |
| | | | 257/E21.499 |
| 7,687,313 B2 * | 3/2010 | Karnezos | 438/107 |
| 7,749,807 B2 * | 7/2010 | Karnezos | 438/109 |
| 7,883,947 B1 * | 2/2011 | Cheng et al. | 438/171 |
| 8,039,304 B2 * | 10/2011 | Pagaila | H01L 21/561 |
| | | | 257/E21.705 |
| 8,102,040 B2 * | 1/2012 | Chow et al. | 257/686 |
| 8,169,058 B2 * | 5/2012 | Pagaila et al. | 257/629 |
| 8,319,330 B2 * | 11/2012 | Murakami et al. | 257/687 |
| 8,426,980 B2 | 4/2013 | Su et al. | 257/777 |
| 2002/0079590 A1 * | 6/2002 | Nakaoka et al. | 257/777 |
| 2002/0192867 A1 * | 12/2002 | Nishiyama | 438/110 |
| 2003/0032216 A1 * | 2/2003 | Nakaoka et al. | 438/106 |
| 2003/0045030 A1 * | 3/2003 | Hayashida et al. | 438/110 |
| 2003/0199122 A1 * | 10/2003 | Wada et al. | 438/113 |
| 2003/0224540 A1 * | 12/2003 | Watanabe et al. | 438/7 |
| 2005/0034888 A1 | 2/2005 | Hoffmann et al. | |
| 2006/0159839 A1 * | 7/2006 | Suwa | C08G 73/101 |
| | | | 427/66 |
| 2011/0037169 A1 * | 2/2011 | Pagaila | H01L 21/561 |
| | | | 257/737 |

FOREIGN PATENT DOCUMENTS

| | | |
|---|---|---|
| JP | 2002-198487 A | 7/2002 |
| JP | 2003-060154 A | 2/2003 |
| JP | 2004-056296 A | 2/2004 |
| JP | 2005-514846 A | 5/2005 |
| JP | 2006-100587 A | 4/2006 |
| JP | 2006-211612 A | 8/2006 |
| JP | 2006-351591 A | 12/2006 |
| JP | 2010-141085 A | 6/2010 |

* cited by examiner

↓ RESIN APPLICATION, DEVELOPMENT, EXPOSURE

↓ ELEMENT MOUNTING (FCB)

↓ RESIN CURING

↓ ELEMENT GRINDING

↓ DICING

↓ BUMP FORMATION

↓ DICING

↓ HALF-CUTTING

↓ THERMAL COMPRESSION BONDING

↓ GRINDING

↓ EXTERNAL TERMINAL FORMATION

↓ DICING

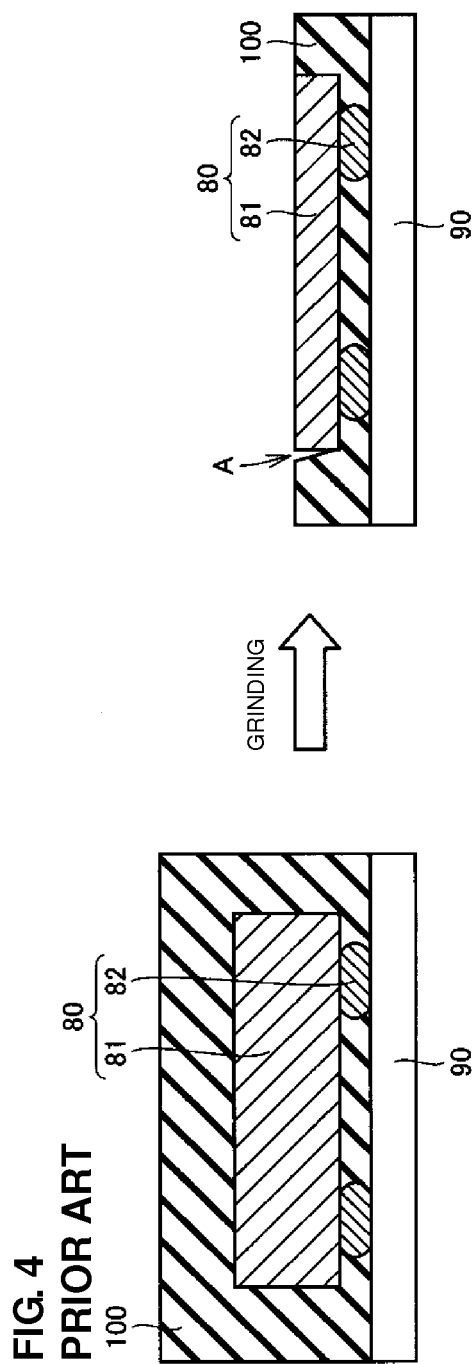

ELECTRONIC COMPONENT AND METHOD FOR MANUFACTURING ELECTRONIC COMPONENT

BACKGROUND OF THE INVENTION

1. Field of the Invention

The present invention relates to an electronic component and a method for manufacturing an electronic component, and in particular, relates to a method for manufacturing an electronic component, including a step of grinding electrical elements or boards, and an electronic component manufactured by the manufacturing method.

2. Description of the Related Art

Japanese Unexamined Patent Application Publication No. 2006-100587 discloses the following method for manufacturing a solid-state imaging device. First, grooves of a predetermined depth are formed in a wafer having a plurality of solid-state imaging elements formed on a front surface thereof, so as to define each solid-state imaging element. Then, as shown in the left-hand portion of FIG. 3, the wafer 60 and a board 50 are joined to each other via spacers 70 which enclose the solid-state imaging elements. After the wafer 60 and the board 50 are joined to each other, the wafer 60 is ground on a back side thereof to form the solid-state imaging elements into individual pieces. Then, the board 50 is diced to produce individual solid-state imaging devices.

Japanese Unexamined Patent Application Publication No. 2001-332654 discloses the following method for manufacturing a module including an electrical element. First, an electrical element 81 having an electrical element formed on a front surface thereof is flip-chip bonded onto a wiring board 90 via bumps 82 and sealed with a thermosetting resin 100. Then, the back surface of the electrical element 81 and the thermosetting resin 100 are ground simultaneously to reduce the height.

In the solid-state imaging device manufacturing method disclosed in Japanese Unexamined Patent Application Publication No. 2006-100587, during grinding of the wafer 60, a physical load is applied from a grinding stone to the wafer 60 not only in the vertical direction but also in the horizontal direction. When the grinding of the wafer 60 progresses and the solid-state imaging elements are divided to define individual pieces, a sufficient retaining force is not applied to each solid-state imaging element in the horizontal direction, and thus the electrical elements are likely to be separated from the spacers 70 due to the horizontal load from the grinding stone, as shown in FIG. 3 (the right-side diagram).

In the electrical element-included module manufacturing method disclosed in Japanese Unexamined Patent Application Publication No. 2001-332654, when the electrical element 81 is ground, not only the electrical element 81 but also the thermosetting resin 100 are ground simultaneously. Thus, due to a horizontal physical load during the grinding, the interface between the side surface of the electrical element 81 and the thermosetting resin 100 is likely to be separated to produce a gap (A in FIG. 4). When a gap is produced between the side surface of the electrical element 81 and the thermosetting resin 100, moisture and the like enter the gap and hence the weather resistance of the electrical element-included module deteriorates.

SUMMARY OF THE INVENTION

In view of the problems described above, preferred embodiments of the present invention provide a method for manufacturing an electronic component that prevents separation of an electrical element from a member which retains or seals the electrical element, during manufacturing of the electronic component; and an electronic component manufactured by the manufacturing method, which has excellent mechanical strength and weather resistance.

According to a preferred embodiment of the present invention, an electronic component includes an electrical element including first and second principal surfaces opposed to each other, side surfaces connecting the principal surfaces, and a functional portion provided on the first principal surface; a board including first and second principal surfaces opposed to each other and side surfaces connecting the principal surfaces, the first principal surface being arranged so as to face the first principal surface of the electrical element; and a resin interposed between the first principal surface of the electrical element and the first principal surface of the board. The second principal surface of either one of the electrical element or the board is a ground surface which has been subjected to grinding, and the resin includes a joining portion which covers a portion of the side surfaces of either one of the electrical element or the board and which is separated from the ground surface.

In a preferred embodiment of the present invention, in the electronic component, the resin includes a hollow portion above the functional portion of the electrical element.

In another preferred embodiment of the present invention, in the electronic component, the electrical element is a surface acoustic wave element.

According to a further preferred embodiment of the present invention, a method for manufacturing an electronic component includes the steps of preparing a plurality of electrical elements; preparing a base including a plurality of boards on which the plurality of electrical elements are to be mounted, respectively; forming a resin layer on the base; pressing the plurality of electrical elements against the resin layer to join portions of side surfaces of the plurality of electrical elements to the resin layer; grinding the plurality of electrical elements to thin the plurality of electrical elements; and dividing the base to form the plurality of boards into individual pieces.

According to another preferred embodiment of the present invention, a method for manufacturing an electronic component includes the steps of preparing a first base on which a plurality of electrical elements are formed; forming a resin layer on the first base; preparing a second base including a plurality of projections on a front surface thereof; pressing the plurality of projections against the resin layer to join portions of side surfaces of the plurality of projections to the resin layer; grinding a back surface of the second base to form the plurality of projections into individual pieces to form a plurality of boards; and dividing the first base to form the plurality of electrical elements into individual pieces.

In a preferred embodiment of the present invention, the method further includes the step of providing a plurality of recesses in the resin layer after the resin layer is formed.

In another preferred embodiment of the present invention, in the method, the resin layer preferably is a photosensitive resin, for example.

According to various preferred embodiments of the present invention, during manufacturing of an electronic component, separation of the electrical element from a member which retains or seals the electrical element is reliably prevented. In addition, an electronic component having excellent mechanical strength and reliability can be realized.

The above and other elements, features, steps, characteristics and advantages of the present invention will become

BRIEF DESCRIPTION OF THE DRAWINGS

FIG. 4 is a diagram (part 2) showing a problem of an existing method for manufacturing an electronic component.

DETAILED DESCRIPTION OF THE PREFERRED EMBODIMENTS

Figure 1D:
FIGS. 1A to 1I are diagrams showing each step of a method for manufacturing an electronic component according to Preferred Embodiment 1 of the present invention.

Hereinafter, preferred embodiments of the present invention will be described. It should be noted that like or corresponding portions are designated by the same reference characters and the description thereof may not be repeated.

It should be noted that in the preferred embodiments described below, when a number, an amount, and the like are mentioned, the scope of the present invention is not necessarily limited to the number, the amount, and the like unless otherwise specified. In addition, in the preferred embodiments described below, each component is not necessarily essential for the present invention unless otherwise specified.

Preferred Embodiment 1

FIGS. 1A-1I are diagrams showing each step of a method for manufacturing an electronic component according to Preferred Embodiment 1. Each step will be described with reference to FIGS. 1A-1I.

Figure 1E:
Figure 1F:
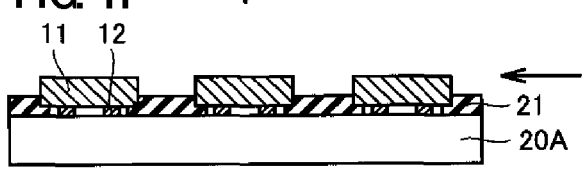
Figure 1G:
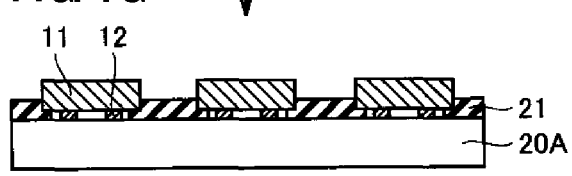
Figure 1H:
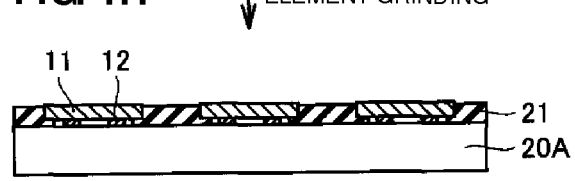
Figure 1I:
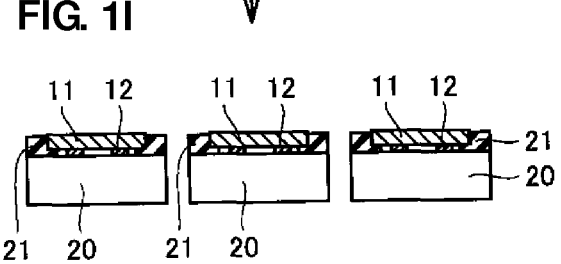
Figure 1A:
Figure 1B:
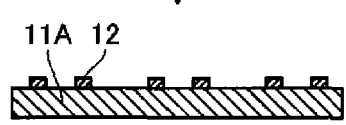

First, as shown in FIG. 1A, a wafer 11A (for example, having a thickness of about 250 μm) is prepared in which functional portions, wires, and pad electrodes of a plurality of electrical elements 11 are formed on a front surface thereof by a thin film microfabrication technique. Next, as shown in FIG. 1B, stud bumps 12 made of gold (Au) are formed on the pad electrodes of the electrical elements 11. Further, as shown in FIG. 1C, the wafer 11A is diced to divide the electrical elements 11 into individual rectangular chips.

Meanwhile, as shown in FIG. 1D, a base 20A including a plurality of wiring boards 20 on which the electrical elements 11 are to be mounted is prepared. Next, as shown in FIG. 1E, a photosensitive resin 21 is applied to a front surface of the base 20A. Then, a plurality of recesses are formed in the resin 21 by a photolithographic technique. Here, the recesses of the resin 21 are opened such that land electrodes corresponding to the pad electrodes of the electrical elements 11 are exposed. In addition, the openings of the recesses are formed so as to be preferably smaller than the electrical elements 11.

Figure 1C:

As shown in FIG. 1F, the electrical elements 11 which are made into the individual pieces in the step shown in FIG. 1C are flip-chip bonded (FCB) onto the base 20A. Specifically, the electrical elements 11 are arranged so as to seal the openings of the recesses of the resin 21 and such that the stud bumps 12 formed on the pad electrodes of the electrical elements 11 are located above the land electrodes of the base 20A. Then, back surfaces of the electrical elements 11 are pressed toward the base 20A while ultrasonic vibrations are applied thereto by a bonding tool. By so doing, the pad electrodes of the electrical elements 11 are connected to the land electrodes of the base 20A via the stud bumps 12. In addition, the resin 21 is not cured at that time, and thus the electrical elements 11 can be dug into the resin 21. Thus, the resin 21 moves around to the side surfaces of the electrical elements 11.

Next, as shown in FIG. 1G, the resin 21 which is also thermosetting is heated at a temperature of about 300° C. to about 400° C., for example, to be cured. By so doing, portions of the electrical elements 11 are joined to the resin 21, whereby the electrical elements 11 are retained by the resin 21. Moreover, as shown in FIG. 1H, the back surfaces of the electrical elements 11 are ground such that the electrical elements 11 are thinned to desired thicknesses, for example, about 150 μm. The thicknesses of the electrical elements 11 are preferably smaller, but the grinding is ended before a grinding stone reaches the resin 21. Thus, the resin 21 is not ground.

Finally, as shown in FIG. 1I, the base 20A is diced together with the resin 21 to divide the wiring boards 20 into individual pieces, whereby a plurality of electronic components are completed.

Each of the electronic components completed thus preferably includes the electrical element 11 including first and second principal surfaces opposed to each other, side surfaces connecting the principal surfaces, and the functional portion provided on the first principal surface; the wiring board 20 including first and second principal surfaces opposed to each other and side surfaces connecting the principal surfaces, the first principal surface being arranged so as to face the first principal surface of the electrical element 11; the resin 21 interposed between the first principal surface of the electrical element 11 and the first principal surface of the wiring board 20. The second principal surface of the electrical element 11 is a ground surface which has been subjected to grinding. The resin 21 includes a joining portion which covers a portion of the side surfaces of the electrical element 11 and which is separated from the ground surface. In addition, the resin 21 includes a hollow portion which seals the functional portion of the electrical element 11.

It should be noted that each electrical element 11 may be a surface acoustic wave element, a piezoelectric thin-film element, a thin-film circuit element, a semiconductor element, or another element.

In this preferred embodiment, as the material of the wiring boards 20, ceramics such as alumina are typically considered, but monocrystals such as Si, LiTaO3, LiNbO3, and crystal and resins such as glass epoxy resins can also be used. It should be noted that in the present invention, bases for the electrical elements are not limited to the above-described wiring boards, and boards which serve as electrical elements may be used, for example.

Further, when, for example, a photosensitive resin such as a photosensitive polyimide resin is used as the resin 21, patterning accuracy of the recesses is improved, whereby the side surfaces of the electrical elements 11 can more assuredly be protected. However, the resin 21 is not limited to the photosensitive resin, and a material other than the photosensitive resin may be used to form recesses therein by etching or other suitable process, for example.

It should be noted that an initial thickness (a state of FIG. 1E) of the resin 21 is adjusted such that the height of the resin 21 that moves around to the side surfaces of the electrical elements 11 when the electrical elements 11 are flip-chip bonded onto the boards 20 is lower than the sum of the final thickness of the electrical elements 11 after the grinding and the final height of the stud bumps 12 after the FCB. The initial thickness of the resin 21 is adjusted on the basis of conditions of the viscosity of the resin 21, the number of rotations of spin application, and the like.

Similarly, the conditions of the FCB are adjusted such that the final height of the stud bumps 12 is lower than the initial thickness of the resin 21. The conditions of the FCB mean the volume of each stud bump 12, a load of the bonding tool, the ultrasonic wave conditions, and the like.

According to the electronic components and the manufacturing method thereof according to this preferred embodiment, the side surfaces of the electrical elements 11, which are ground members, are retained by the resin 21, and thus separation of the electrical elements 11 due to a horizontal physical load at grinding can be reliably prevented.

Further, the resin 21 retains only a region smaller than the thickness of the electrical elements 11 after grinding, and thus is not ground. Therefore, the interfaces between the electrical elements 11 and the resin 21 are not separated due to a physical load at grinding.

Moreover, the hollow portion of the resin 21 is closed, and each electronic component has excellent weather resistance. In particular, this preferred embodiment is suitable for electrical elements 11 that are surface acoustic wave elements in which a hollow portion is needed above an interdigital transducer (IDT) which is a functional portion.

A summary of the above description is as follows. Specifically, the method for manufacturing an electronic component according to this preferred embodiment includes a step of preparing a plurality of electrical elements 11 (FIGS. 1A to 1C), a step of preparing a base 20A preferably including a plurality of boards 20 on which the plurality of electrical elements 11 are to be mounted, respectively (FIG. 1D), a step of forming a resin 21 as a "resin layer" on the base 20A (FIG. 1E), a step of pressing the plurality of electrical elements 11 against the resin 21 to join portions of the side surfaces of the plurality of electrical elements 11 to the resin 21 (FIGS. 1F and 1G), a step of grinding the plurality of electrical elements 11 to thin the plurality of electrical elements 11 (FIG. 1H), and a step of dividing the base 20A to form the plurality of boards 20 into individual pieces (FIG. 1I).

Preferred Embodiment 2

FIGS. 2A to 2H are diagrams showing each step of a method for manufacturing an electronic component according to Preferred Embodiment 2. Each step will be described with reference to FIGS. 2A to 2H.

Figure 2C:
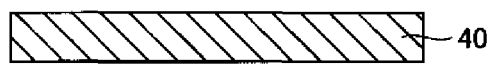
FIGS. 2A to 2H are diagrams showing each step of a method for manufacturing an electronic component according to Preferred Embodiment 2 of the present invention.
Figure 2D:
Figure 2A:
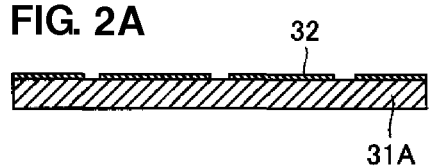
Figure 2B:
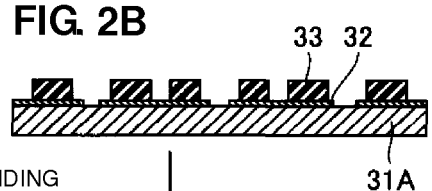

First, as shown in FIG. 2A, a wafer 31A is prepared in which functional portions, wires, and electrode patterns 32 of a plurality of electrical elements 31, which electrode patterns 32 are to be pad electrodes, are formed on a front surface thereof by a thin film microfabrication technique. Next, a film type photosensitive resin is adhered to the front surface of the wafer 31A, and a plurality of recesses are formed in the resin 33 by a photolithographic technique such that the functional portions of the electrical elements 31 are exposed as shown in FIG. 2B. At the same time, a plurality of grooves are formed in a matrix so as to define the recesses and such that, at least portions of the pad electrodes of the electrical elements 31 are exposed. Since the film type is used as the resin 33 as described above, the thickness of the resin 33 can precisely be controlled. As a film type resin, it is considered to use, for example, polyimide resins, epoxy resins, and the like.

Meanwhile, as shown in FIG. 2C, a cap wafer 40 (for example, having a thickness of about 350 μm) which is to be finally a cap of a package is prepared. Next, as shown in FIG. 2D, a front surface of the cap wafer 40 is half-cut by dicing to form a plurality of grooves in a matrix. As a result, a plurality of substantially rectangular projections 40A are formed on the front surface of the cap wafer 40 and defined by the grooves 40B. Here, the projections 40A are formed so as to preferably be larger than the openings of the recesses of the resin 33. It should be noted that the depth of half-cutting preferably is about 125 μm, for example.

Figure 2E:
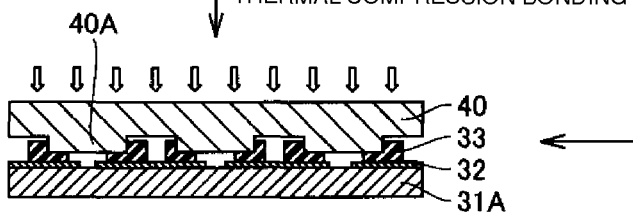

As shown FIG. 2E, the wafer 31A and the cap wafer 40 are stacked to each other at wafer level such that the projections 40A seal the openings of the recesses of the resin 33, and are joined to each other via the resin 33 by thermal pressure bonding. At that time, by a load of the pressure bonding, the resin 33 is caused to enter portions of the grooves 40B of the cap wafer 40. In other words, the front surface side peripheral portions and side surfaces of the projections 40A are joined to the resin 33.

Figure 2F:
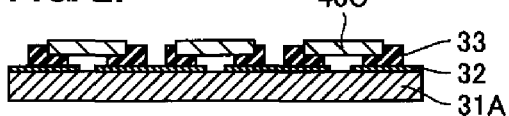

Next, as shown in FIG. 2F, the cap wafer 40 is ground to a thickness of about 100 μm, for example, to form the projections 40A into individual pieces. By so doing, the projections 40A become cap boards 40C which seal the recesses of the resin 33.

Figure 2G:
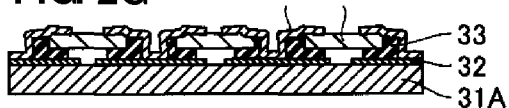

Further, as shown in FIG. 2G, the cap boards 40C, the resin 33, and the wafer 31A are coated with a metal film by a film formation method such as sputtering or plating. Then, a photoresist is applied onto the metal film and is pattern-formed by a photolithographic technique, and then external terminals 50 are formed by an etching technique. Here, the external terminals 50 are connected to at least portions of the pad electrodes which are exposed from the grooves of the resin 33.

Figure 2H:
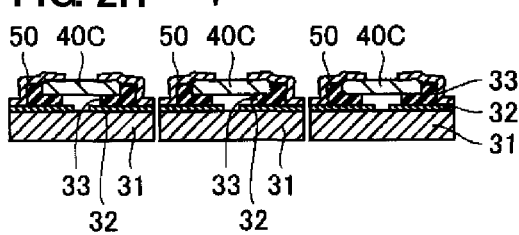
Figure 3:
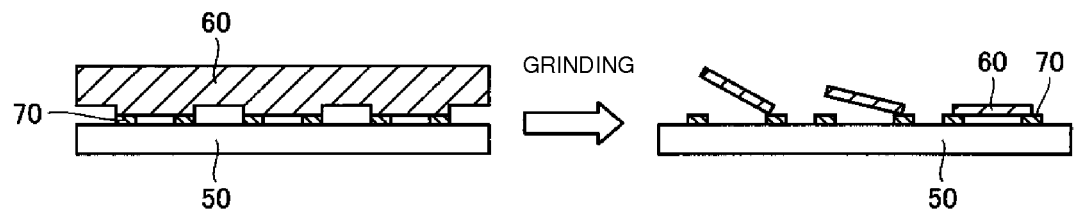
FIG. 3 is a diagram (part 1) showing a problem of an existing method for manufacturing an electronic component.

Finally, as shown in FIG. 2H, dicing is performed along the grooves of the resin 33 to divide the wafer 31A into pieces, whereby a plurality of electronic components are completed.

Each of the electronic components thus completed includes the electrical element 31 including first and second principal surfaces opposed to each other, side surfaces connecting the principal surfaces, and the functional portion provided on the first principal surface; the cap board 40C including first and second principal surfaces opposed to each other and side surfaces connecting the principal surfaces, the first principal surface being arranged so as to face the first principal surface of the electrical element 31; and the resin 33 interposed between the first principal surface of the electrical element 31 and the first principal surface of the cap board 40C. The second principal surface of the cap board 40C is a ground surface which has been subjected to grinding. The resin 33 includes a joining portion which covers a portion of the side surfaces of the cap board 40C and which is separated from the ground surface. In addition, the resin 33 includes a hollow portion which seals the functional portion of the electrical element 31.

According to the electronic components and the manufacturing method thereof according to this preferred embodiment, the side surfaces of the projections 40A of the wafer 40, which is a ground member, are retained by the resin 33, and thus separation of the cap boards 40C (the projections 40A that are formed into the individual pieces) due to a horizontal physical load at grinding can be prevented.

Further, the resin 33 retains only a region smaller than the thickness of the cap boards 40C, and thus is not ground. Therefore, the interfaces between the cap boards 40C and the resin 33 are not separated due to a physical load at grinding.

To summarize the above contents, the method for manufacturing an electronic component according to this preferred embodiment includes a step of preparing a wafer 31A as a "first base" in which a plurality of electrical elements 31 are formed (FIG. 2A); a step of forming a resin 33 as a "resin layer" on the wafer 31A (FIG. 2B); a step of preparing the wafer 40 as a "second base" including a plurality of projections 40A on a front surface thereof (FIGS. 2C and 2D); a step of pressing the plurality of projections 40A against the resin 33 to join portions of the side surfaces of the plurality of projections 40A to the resin 33 (FIG. 2E); a step of grinding a back surface of the wafer 40 to form the plurality of projections 40A into individual pieces to form a plurality of cap boards 40C (FIG. 2F); and a step of dividing the wafer 31A to form the plurality of electrical elements 31 into individual pieces (FIG. 2H).

While preferred embodiments of the present invention have been described above, it is to be understood that variations and modifications will be apparent to those skilled in the art without departing from the scope and spirit of the invention. The scope of the present invention, therefore, is to be determined solely by the following claims.

What is claimed is:

1. A method for manufacturing an electronic component, the method comprising the steps of:
   preparing a plurality of electrical elements each including first and second principal surfaces that are opposed to each other and side surfaces that extend between and connect the first and second principal surfaces;
   preparing a base including a plurality of boards on which the plurality of electrical elements are to be mounted, respectively;
   forming a resin layer on the base;
   pressing the plurality of electrical elements against the resin layer to join portions of the side surfaces of the plurality of electrical elements to the resin layer, such that the resin layer is in direct contact with the portions of the side surfaces of the plurality of electrical elements, the resin layer is spaced away and separated from one of the first and second principal surfaces of each of the plurality of electrical elements to be subjected to grinding, and the resin layer is spaced away from a central portion of another one of the first and second principal surfaces of each of the plurality of electrical elements opposite to the one of the first and second principal surfaces of each of the plurality of electrical elements to be subjected to grinding;
   grinding the one of the first and second principal surfaces of each of the plurality of electrical elements such that a thickness of each of the plurality of electrical elements defined by a distance between the first and second principal surfaces is reduced; and
   dividing the base to form the plurality of boards into individual pieces after the step of grinding the one of the first and second principal surfaces of each of the plurality of electrical elements; wherein
   the step of forming the resin layer on the base is performed before the step of pressing the plurality of electrical elements against the resin layer.

2. The method according to claim 1, further comprising the step of providing a plurality of recesses in the resin layer after the resin layer is formed.

3. The method according to claim 2, wherein the resin layer is a photosensitive resin.

4. A method for manufacturing an electronic component, the method comprising the steps of:
   preparing a first base on which a plurality of electrical elements are formed;
   forming a resin layer on the first base;
   preparing a second base;
   forming including a plurality of projections on a front surface of the second base thereof;
   pressing the plurality of projections against the resin layer to join portions of side surfaces of the plurality of projections to the resin layer, such that the resin layer is spaced away and separated from a back surface of the second base to be subjected to grinding;
   grinding the back surface of the second base such that only the plurality of projections remain as individual pieces defining a plurality of boards; and
   dividing the first base to form the plurality of electrical elements into individual pieces after the step of grinding the back surface of the second base; wherein
   the step of forming the plurality of projections on the front surface of the second base is performed before the step of pressing the plurality of projections against the resin layer.

5. The method according to claim 4, further comprising the step of providing a plurality of recesses in the resin layer after the resin layer is formed.

6. The method according to claim 5, wherein the resin layer is a photosensitive resin.

* * * * *